(12) United States Patent
Lee (10) Patent No.: US 9,210,800 B1
(45) Date of Patent: Dec. 8, 2015

(54) CIRCUIT LAYOUT STRUCTURE, CIRCUIT BOARD AND ELECTRONIC ASSEMBLY

(71) Applicant: VIA Technologies, Inc., New Taipei (TW)

(72) Inventor: Sheng-Yuan Lee, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 14/533,098

(22) Filed: Nov. 5, 2014

Related U.S. Application Data (60) Provisional application No. 62/025,975, filed on Jul. 17, 2014.

(30) Foreign Application Priority Data

Sep. 4, 2014 (TW) .............................. 103130620 A (51) Int. Cl.
| | |
|---|---|
| *H01L 23/48* | (2006.01) |
| *H01L 23/52* | (2006.01) |
| *H01L 29/40* | (2006.01) |
| *H05K 1/02* | (2006.01) |
| *H01P 3/08* | (2006.01) |

(52) U.S. Cl.
CPC ................ *H05K 1/0245* (2013.01); *H01P 3/08* (2013.01); *H05K 1/0224* (2013.01)

(58) Field of Classification Search
CPC ..................... H01L 23/49838; H01L 23/4984; H01L 24/30; H01L 24/33; H01L 24/46; H01L 24/25; H01L 24/42; H01L 24/49; H01L 24/67; H01L 24/70
See application file for complete search history.

(56) References Cited

U.S. PATENT DOCUMENTS

| | | | |
|---|---|---|---|
| 2010/0181101 A1* | 7/2010 | Han et al.h05k ..... | H05K 1/0216 174/260 |
| 2011/0304998 A1* | 12/2011 | Lin et al. ........... | H01L 23/49838 361/783 |

* cited by examiner

*Primary Examiner* — Thanh Y Tran
(74) *Attorney, Agent, or Firm* — Jianq Chyun IP Office (57) ABSTRACT

A circuit layout structure is suitable for a circuit board and includes following components. A first differential pair and a second differential pair respectively extend from the inside of a chip area of the circuit board to the outside of the chip area through a first patterned conductive layer of the circuit board, and respectively extend between the chip area and a port area of the circuit board through a second patterned conductive layer of the circuit board. A third differential pair extends from the chip area to the port area through the first patterned conductive layer. A first ground plane is constituted by the first patterned conductive layer. Orthogonal projections of the first differential pair and the second differential pair on the second patterned conductive layer overlap the first ground plane.

21 Claims, 5 Drawing Sheets

CIRCUIT LAYOUT STRUCTURE, CIRCUIT BOARD AND ELECTRONIC ASSEMBLY

CROSS-REFERENCE TO RELATED APPLICATION

This application claims the priority benefits of U.S. provisional application Ser. No. 62/025,975, filed on Jul. 17, 2014 and Taiwan application serial no. 103130620, filed on Sep. 4, 2014. The entirety of each of the above-mentioned patent applications is hereby incorporated by reference herein and made a part of this specification.

BACKGROUND OF THE INVENTION

1. Field of the Invention

The invention relates to a circuit board; more particularly, the invention relates to a circuit layout structure suitable for a circuit board to reduce signal interference, a circuit board having the circuit layout structure, and an electronic assembly having the circuit layout structure.

2. Description of Related Art

At present, the USB 3.0 has become a very popular standard, whereas issues of electromagnetic interference (EMI)/radio frequency interference (RFI) may arise at the frequency of approximately 2.5 GHz. Since the data rate and the clock frequency of the USB 3.0 standard are 5 Gbps and 2.5 GHz, respectively, devices (e.g., a wireless module of a wireless mouse) with the operating frequency at approximately 2.5 GHz may be interfered by USB 3.0 signals and may fail to work.

For instance, a USB 3.0 hub has a circuit board, a USB 3.0 chip, and a USB 3.0 electrical connector. The USB 3.0 chip and the USB 3.0 electrical connector are installed on the circuit board, and the USB 3.0 chip is often electrically connected to the USB 3.0 electrical connector through surface circuits of the circuit board. If the casing of the USB 3.0 hub is made of plastic and is not covered by appropriate metal materials, the frequency of RFI from the USB 3.0 signals (with the clock frequency at 2.5 GHz) transmitted through the surface circuits of the circuit board is approximately at 2.5 GHz. Such EMI/RFI may pose an impact on the wireless module of the wireless mouse with the operating frequency at approximately 2.4 GHz.

SUMMARY OF THE INVENTION

The invention is directed to a circuit layout structure suitable for a circuit board, and the circuit layout structure is configured to reduce interference with the environment during signal transmission.

The invention is directed to a circuit board configured to reduce interference with the environment during signal transmission.

The invention is directed to an electrical assembly configured to reduce interference with the environment during signal transmission.

A circuit layout structure of the invention is suitable for a circuit board. The circuit board has a chip area, a port area, a first patterned conductive layer, a second conductive layer, a dielectric layer, and a plurality of conductive vias. The first patterned conductive layer and the second patterned conductive layer are separated from each other by the dielectric layer. The conductive vias are electrically connected to the first patterned conductive layer and the second patterned conductive layer. The circuit layout structure includes a first differential pair, a second differential pair, a third differential pair, a first ground plane, and a second ground plane. The first differential pair extends from an inside of the chip area to an outside of the chip area through the first patterned conductive layer and extends between the chip area and the port area through the second patterned conductive layer. The second differential pair extends from the inside of the chip area to the outside of the chip area through the first patterned conductive layer and extends between the chip area and the port area through the second patterned conductive layer. The third differential pair extends from the chip area to the port area through the first patterned conductive layer. A first ground plane is constituted by the first patterned conductive layer. An orthogonal projection of the first differential pair on the second patterned conductive layer overlaps the first ground plane. An orthogonal projection of the second differential pair on the second patterned conductive layer overlaps the first ground plane. The second ground plane is constituted by the second patterned conductive layer and has a first opening and a second opening. The first differential pair and the second differential pair respectively extend in the first opening and the second opening through the second patterned conductive layer.

A circuit board of the invention includes a plurality of patterned conductive layers, a plurality of dielectric layers, and a plurality of conductive vias. The dielectric layers and the patterned conductive layers are alternately stacked. The conductive vias pass through the dielectric layers, so as to connect the patterned conductive layers. These components constitute said circuit layout structure.

An electronic assembly of the invention includes a circuit board having a chip are and a port area, a chip that is installed in the chip area, and an electrical connector installed in the port area is provided. The circuit board provided herein has said circuit layout structure.

In view of the above, in the invention, the first and second differential pairs initially arranged at the first patterned conductive layer are moved down to the second patterned conductive layer; through the vertical shielding effect achieved by the first ground plane and the horizontal shielding effect achieved by the second ground plane, the interference with the environment during signal transmission through the first and second differential pairs can be reduced.

In order to make the aforementioned features and advantages of the disclosure more comprehensible, embodiments accompanied with figures are described in detail below.

DETAILED DESCRIPTION OF DISCLOSED EMBODIMENTS

Figure 1:
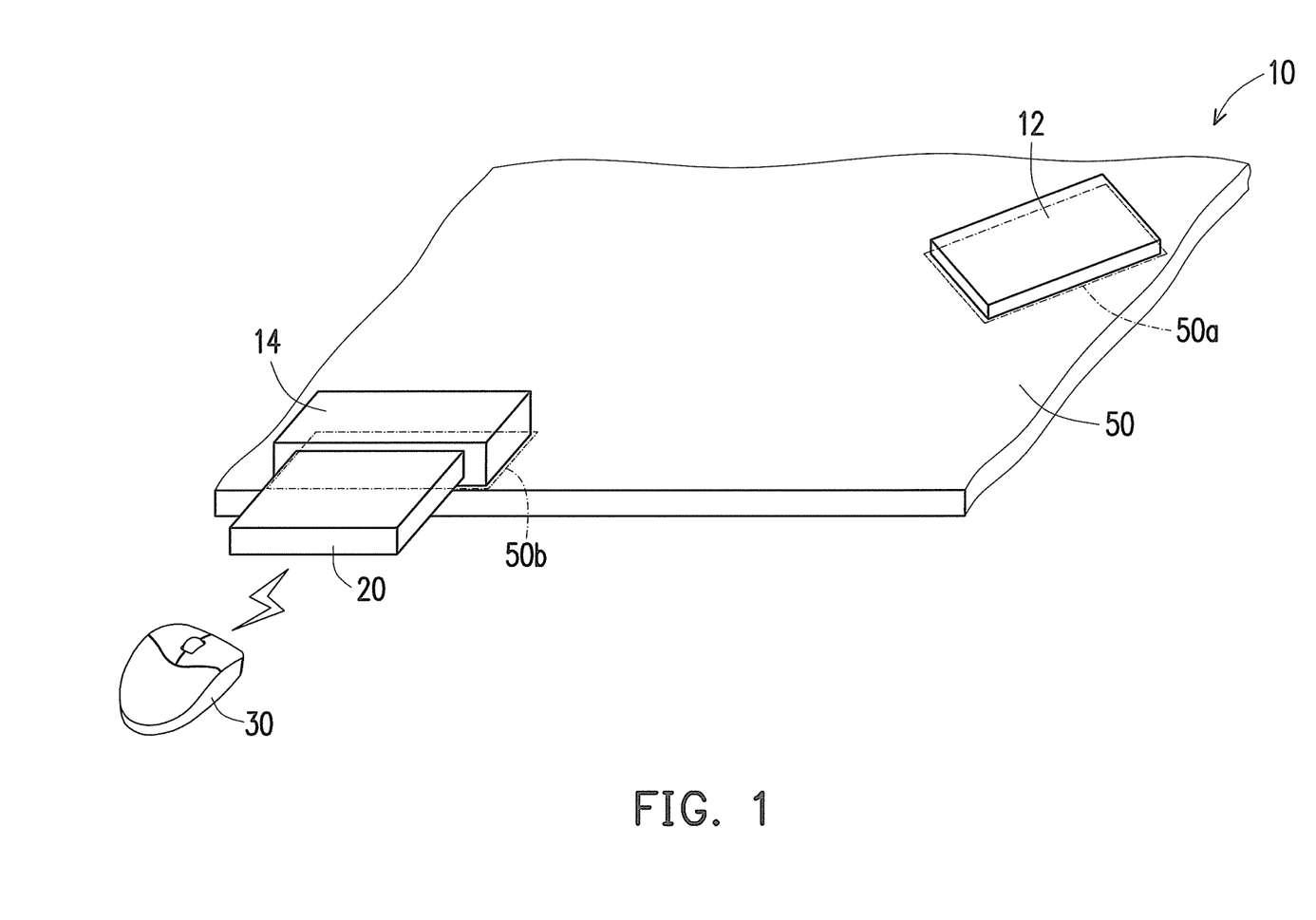
FIG. 1 is a schematic diagram illustrating an electronic assembly according to an embodiment of the invention.

With reference to FIG. 1, in the present embodiment, the electronic assembly 10 includes a chip 12, an electrical connector 14, and a circuit board 50. The circuit board 50 has a chip area 50a and a port area 50b. The chip 12 (e.g., the USB 3.0 chip or the USB 3.1 chip) is installed in the chip area 50a. The electrical connector 14 (e.g., the USB 3.0 electrical connector or the USB 3.1 electrical connector) is installed in the port area 50b. Therefore, the chip 12 located in the chip area 50a can be electrically connected to the electrical connector 14 located in the port area 50b through the circuit board 50.

Figure 2:
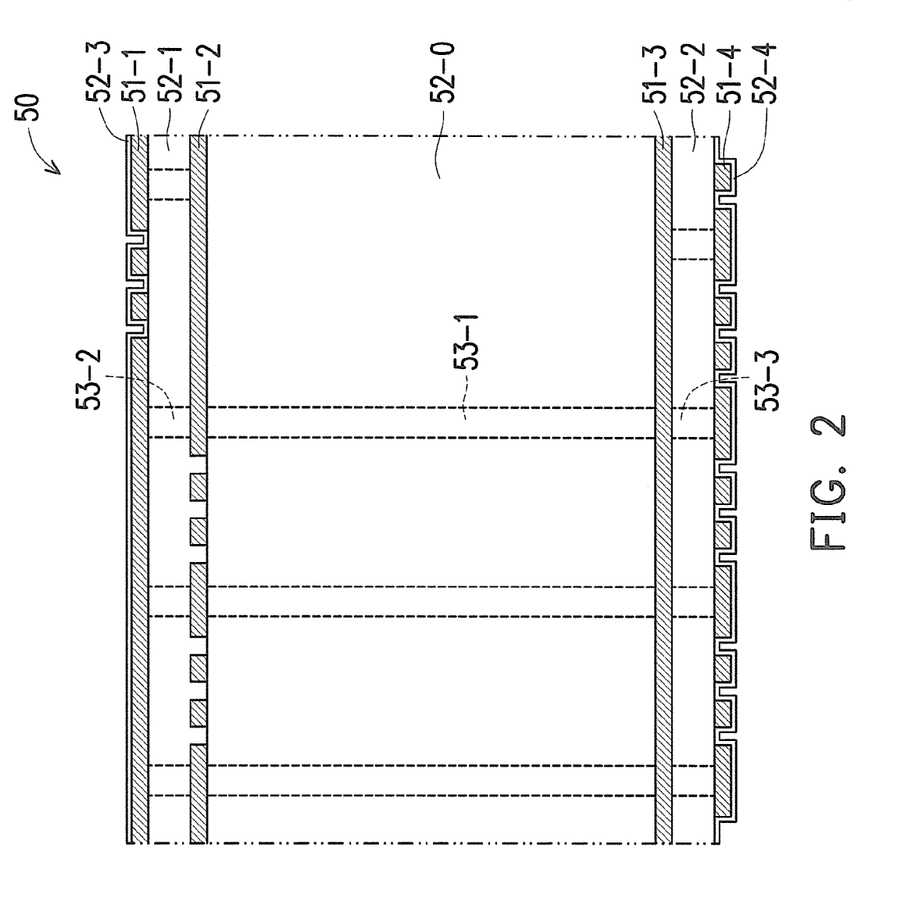
FIG. 2 is a schematic cross-sectional diagram illustrating the circuit board depicted in FIG. 1.

With reference to FIG. 2, in the present embodiment, a circuit board 50 includes a plurality of patterned conductive layers, a plurality of dielectric layers, and a plurality of conductive vias. The dielectric layers and the patterned conductive layers are alternately stacked, and the conductive vias pass through the dielectric layers, so as to connect the patterned conductive layers.

The patterned conductive layers include a first patterned conductive layer 51-1, a second patterned conductive layer 51-2, a third patterned conductive layer 51-3, and a fourth patterned conductive layer 51-4. The dielectric layers include a dielectric core layer 52-0, a first dielectric layer 52-1, and a second dielectric layer 52-2. The conductive vias include conductive vias 53-1, 53-2, and 53-3. The dielectric core layer 52-0 is located between the second patterned conductive layer 51-2 and the third patterned conductive layer 51-3 and electrically connected to the second patterned conductive layer 51-2 and the third patterned conductive layer 51-3 through the conductive via 53-1. The first dielectric layer 52-1 is located between the first patterned conductive layer 51-1 and the second patterned conductive layer 51-2 and electrically connected to the first patterned conductive layer 51-1 and the second patterned conductive layer 51-2 through the conductive via 53-2. The second dielectric layer 52-2 is located between the third patterned conductive layer 51-3 and the fourth patterned conductive layer 51-4 and electrically connected to the third patterned conductive layer 51-3 and the fourth patterned conductive layer 51-4 through the conductive via 53-3. A thickness of the dielectric core layer 52-0 is greater than a thickness of the first dielectric layer 52-1 and a thickness of the second dielectric layer 52-2. A first solder mask layer 52-3 covers the first patterned conductive layer 51-1. A second solder mask layer 52-4 covers the fourth patterned conductive layer 51-4. In the present embodiment, the third patterned conductive layer 51-3 substantially constitutes a power plane; in another embodiment, the third patterned conductive layer 51-3 substantially constitutes a non-ground plane, e.g., a signal plane. The circuit board 50 described in the present embodiment may be a fourth-layer board. According to the present embodiment, the conductive vias 53-1, 53-2, and 53-3 directly pass through the first patterned conductive layer 51-1, the second patterned conductive layer 51-2, the third patterned conductive layer 51-3, and the fourth patterned conductive layer 51-4. According to another embodiment, the conductive vias do not directly pass through the patterned conductive layers (not shown).

Figure 3:
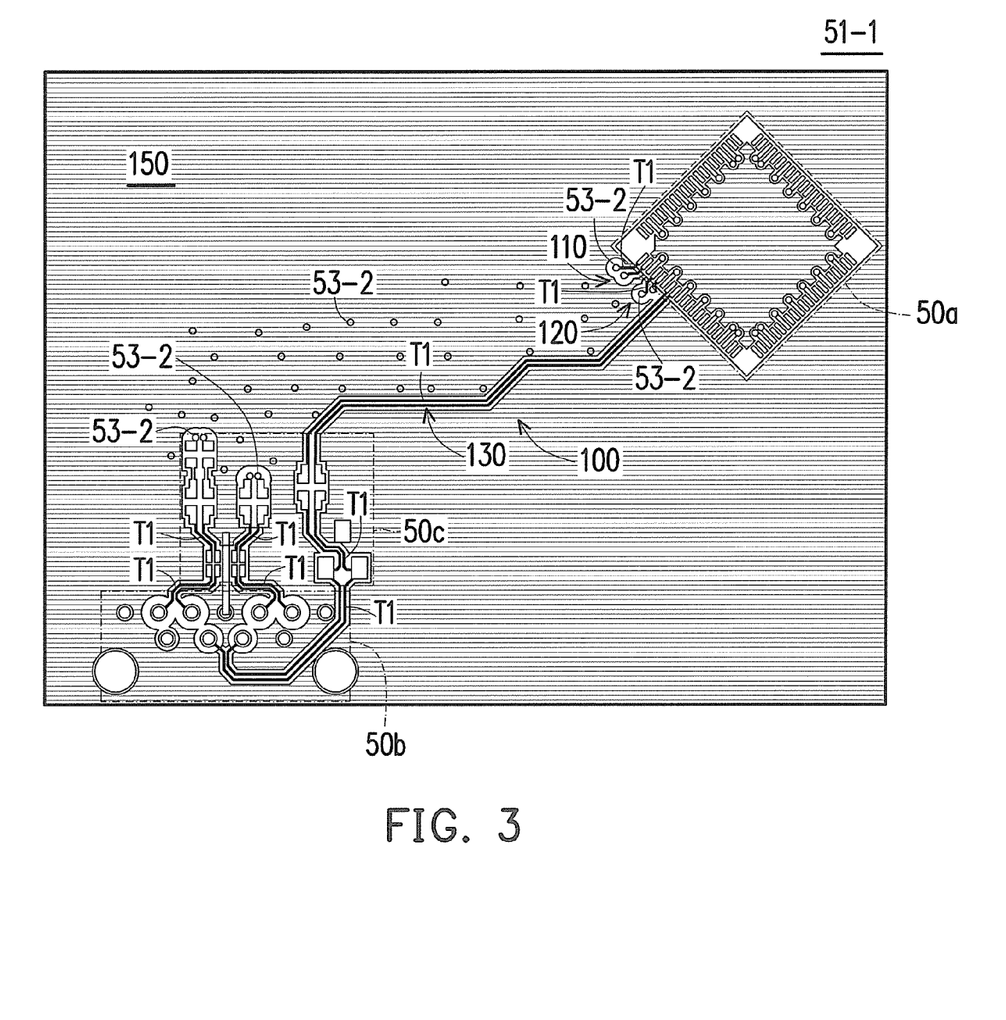
FIG. 3 is a schematic partial plane view illustrating the first patterned conductive layer depicted in FIG. 2.
Figure 4:
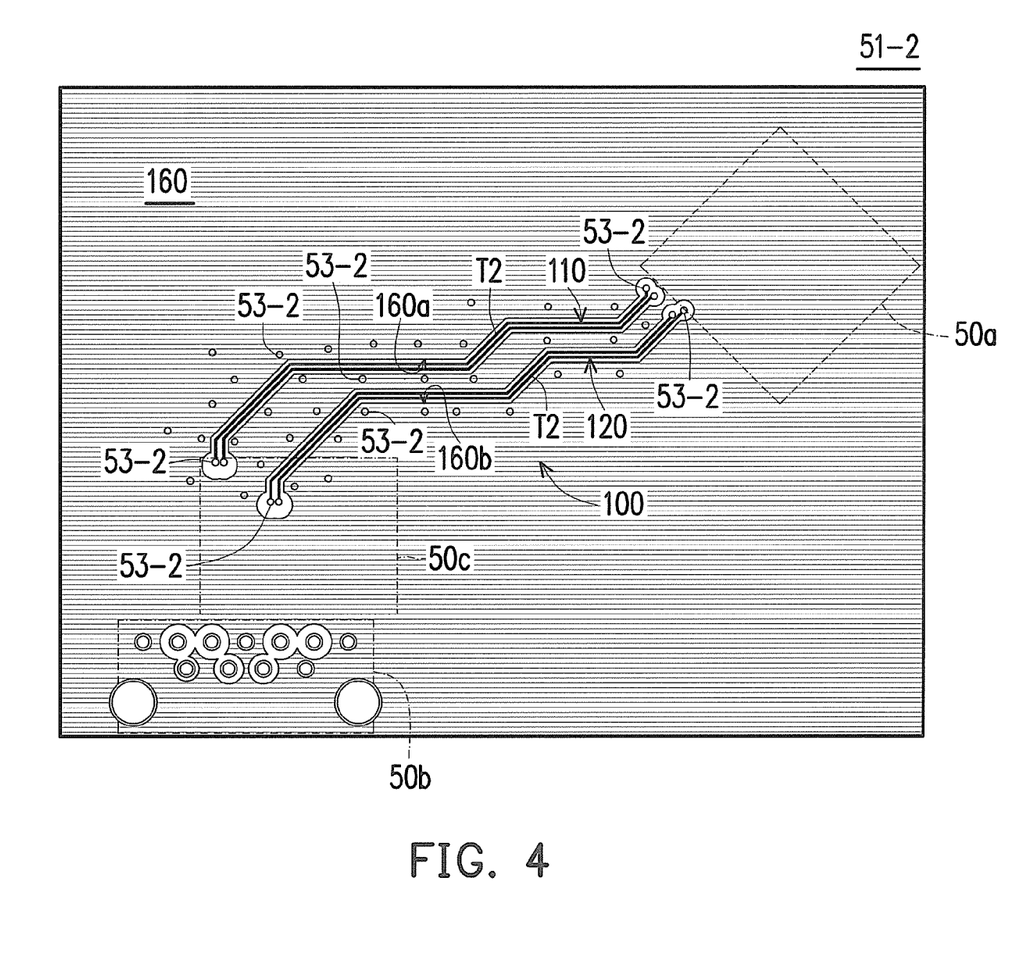
FIG. 4 is a schematic partial plane view illustrating the second patterned conductive layer depicted in FIG. 2.

With reference to FIG. 2, FIG. 3, and FIG. 4, the circuit board 50 further includes a circuit layout structure 100 that has a first differential pair 110, a second differential pair 120, and a third differential pair 130. The first differential pair 110 includes a pair of signal paths, and the pair of signal paths may be a transmitting differential pair Tx+ and Tx− compatible with USB 3.0 or USB 3.1, for instance. The second differential pair 120 includes a pair of signal paths, and the pair of signal paths may be a receiving differential pair Rx+ and Rx− compatible with USB 3.0 or USB 3.1, for instance. Note that the locations of the first and second differential pairs 110 and 120 depicted in FIG. 4 are exemplary and should not be construed as limitations to the invention. The third differential pair 130 includes a pair of signal paths, and the pair of signal paths may be a transmitting/receiving differential pair D+ and D− compatible with USB 1.0 or USB 2.0, for instance. Generally, the transmitting/receiving differential signal terminals (D+ and D−) work in a half-duplex transmission mode, i.e., only one of signal transmission and signal reception can be conducted. In such mode, data cannot be received during data transmission, and data cannot be transmitted during data reception. By contrast, in the USB 3.0 or 3.1 architecture, the transmitting differential signal terminals (Tx+ and Tx−) and the receiving differential signal terminals (Rx+ and Rx−) work in a full-duplex transmission mode, i.e., signal transmission or reception can be directly and simultaneously conducted.

In the circuit layout structure connected between the USB 3.0 chip and the USB 3.0 electrical connector in the conventional circuit board, the three differential pairs are all arranged in the patterned conductive layer that is not grounded, e.g., the first patterned conductive layer 51-1 depicted in FIG. 2, and there will be a ground plane (e.g., the second patterned conductive layer 51-2 depicted in FIG. 2) nearby. However, in the USB 3.0 or 3.1 architecture, the transmitting or receiving differential pairs located in the non-grounded patterned conductive layer may cause EMI/RFI to other devices (e.g., the wireless module of the wireless mouse) during signal transmission or reception. A circuit layout structure capable of resolving said issue is thus provided herein.

With reference to FIG. 2, FIG. 3, FIG. 4, and FIG. 5, the first differential pair 110 extends from the inside of the chip area 50a to the outside of the chip area 50a through a pair of traces T1 of the first patterned conductive layer 51-1 and is connected down to the second patterned conductive layer 51-2 through a pair of conductive vias 53-2. The first differential pair 110 then extends between the chip area 50a and the port area 50b through a pair of traces T2 of the second patterned conductive layer 51-2 and is connected up to the first patterned conductive layer 51-1 through another pair of conductive vias 53-2. Through the pair of traces T1 of the first patterned conductive layer 51-1, the first differential pair 110 extends from the outside of the port area 50b (e.g., a device area) to the inside of the port area 50b. According to the present embodiment, the circuit board 50 may be further equipped with a device area 50c; through at least one pair of traces T1 of the first patterned conductive layer 51-1, the first differential pair 110 extends to pass through the device area 50c and then extends from the outside of the port area 50b to the inside of the port area 50b. Capacitors, electronic discharge protection devices, and other devices may be located in the device area 50c. In another embodiment of the invention, the circuit board 50 is not equipped with the device area 50c. In detail, the first differential pair 110 extends between the chip area 50a and the port area 50b through a pair of traces T2 of the second patterned conductive layer 51-2 and the first differential pair 110 is directly connected up to the port area 50b of the first patterned conductive layer 51-1 through another pair of conductive vias.

With reference to FIG. 2, FIG. 3, FIG. 4, and FIG. 5, similar to the first differential pair 110, the second differential pair 120 extends from the inside of the chip area 50a to the outside of the chip area 50a through a pair of traces T1 of the first patterned conductive layer 51-1 and is connected to the second patterned conductive layer 51-2 through a pair of conductive vias 53-2. The second differential pair 120 then extends between the chip area 50a and the port area 50b through a pair of traces T2 of the second patterned conductive layer 51-2 and is connected up to the first patterned conductive layer 51-1 through another pair of conductive vias 53-2. Through the pair of traces T1 of the first patterned conductive layer 51-1, the second differential pair 120 extends from the outside of the port area 50*b* (e.g., a device area) to the inside of the port area 50*b*. According to the present embodiment, through at least one pair of traces T1 of the first patterned conductive layer 51-1, the second differential pair 120 may extend to pass through the device area 50*c* and may then extend from the outside of the port area 50*b* to the inside of the port area 50*b*. Capacitors, electronic discharge protection devices, and other devices may be located in the device area 50*c*. In another embodiment of the invention, the circuit board 50 is not equipped with the device area 50*c*. In detail, the second differential pair 120 extends between the chip area 50*a* and the port area 50*b* through a pair of traces T2 of the second patterned conductive layer 51-2 and the second differential pair 120 is directly connected up to the port area 50*b* of the first patterned conductive layer 51-1 through another pair of conductive vias.

Figures 5, 6:
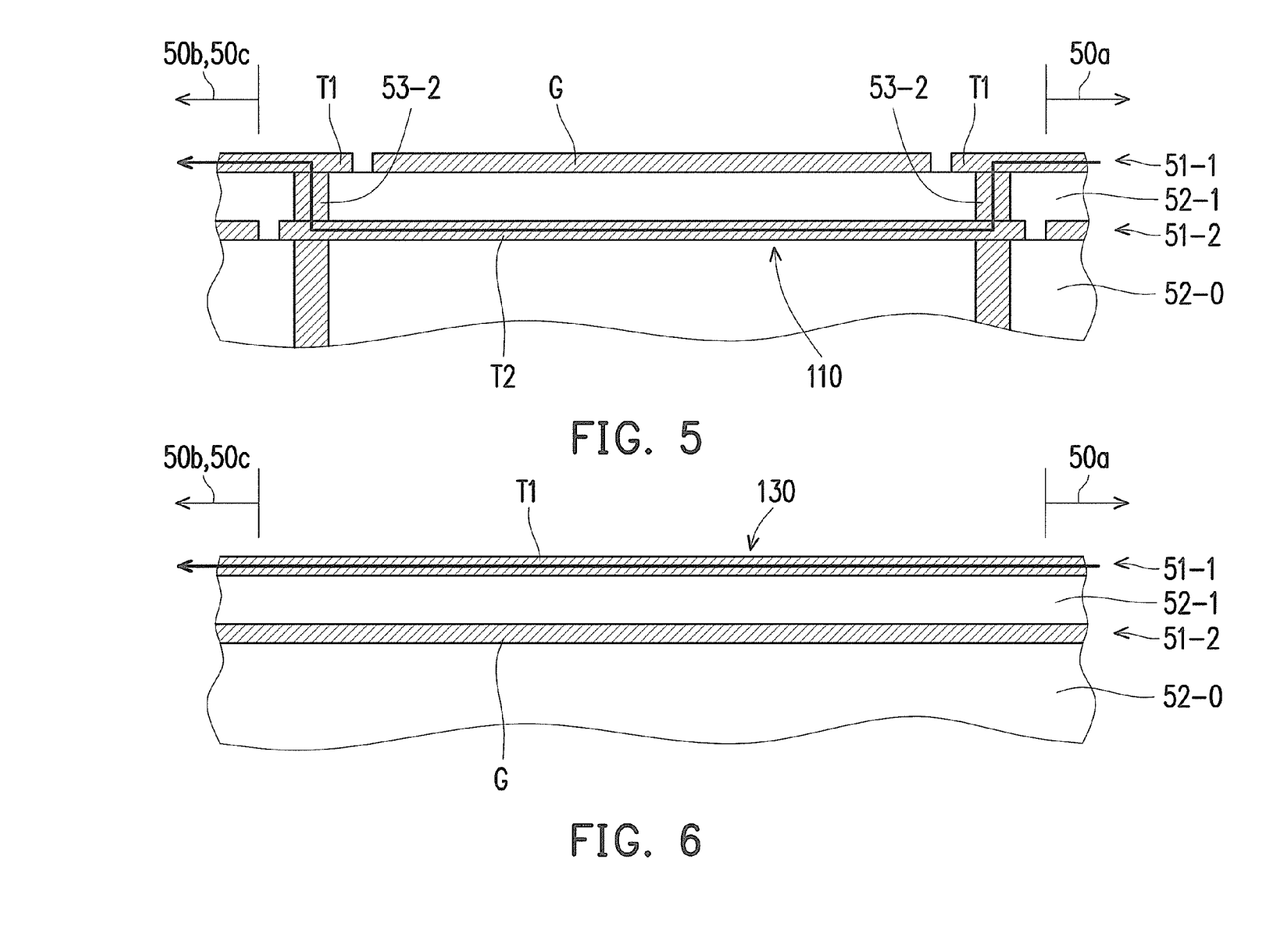
FIG. 5 is a schematic partial plane view illustrating a path of signals transmitted through the first differential pair depicted in FIG. 1.
FIG. 6 is a schematic partial plane view illustrating a path of signals transmitted through the third differential pair depicted in FIG. 1.

With reference to FIG. 3, FIG. 4, and FIG. 5, the first differential pair 110 extends to the outside of the chip area 50*a* through a portion (i.e., a pair of traces T1) of the first patterned conductive layer 51-1, continuously extends to pass through a portion (i.e., a pair of traces T2) of the second patterned conductive layer 51-2, and then extends to the port area 50*b* through another portion (i.e., another pair of traces T1) of the first patterned conductive layer 51-1. The second differential pair 120 and the first different pair 110 extend in a similar manner. With reference to FIG. 3, FIG. 4, and FIG. 6, different from the first and second differential pairs 110 and 120, the third differential pair 130 extends from the chip area 50*a* directly to the port area 50*b* through a portion (i.e., a pair of traces T1) of the first patterned conductive layer 51-1. The main extension parts of the first and second differential pairs 110 and 120 are moved from the first patterned conductive layer 51-1 to the second patterned conductive layer 51-2, which not only resolves the issue of dense distribution of traces but also reduces interference (e.g., EMI/RFI) with the environment during signal transmission due to the shielding effect achieved by the ground plane G of the first patterned conductive layer 51-1. The detailed explanation of the ground plane G is provided hereinafter.

With reference to FIG. 2, FIG. 3, and FIG. 4, the circuit layout structure 100 further includes a first ground plane 150 and a second ground plane 160. The first ground plane 150 is constituted by the first patterned conductive layer 51-1. An orthogonal projection of the first differential pair 110 on the second patterned conductive layer 51-2 overlaps the first ground plane 150. An orthogonal projection of the second differential pair 120 on the second patterned conductive layer 51-2 overlaps the first ground plane 150. The second ground plane 160 is constituted by the second patterned conductive layer 51-2 and has a first opening 160*a* and a second opening 160*b*. The first differential pair 110 extends in the first opening 160*a* through the second patterned conductive layer 51-2. The second differential pair 120 extends in the second opening 160*b* through the second patterned conductive layer 51-2. Namely, each different pair 110 or 120 merely passes through one of the openings 160*a* and 160*b*, and the two differential pairs do not share the same opening. A portion of the second ground plane 160 is further located between the first differential pair 110 and the second differential pair 120. That is, a portion of the second ground plane 160 is located between the first opening 160*a* and the second opening 160*b*. Hence, according to the present embodiment, the differential pairs 110 and 120 configured to transmit signals are arranged on the ground plane; through the vertical shielding effect achieved by the first ground plane 150 and the horizontal shielding effect achieved by the second ground plane 160, the interference (e.g., EMI/RFI) with the environment during signal transmission through the first and second differential pairs 110 and 120 can be reduced.

With reference to FIG. 3 and FIG. 4, some of the conductive vias 53-2 are located next to the first differential pair 110 and the second differential pair 120; some of the conductive vias 53-2 are located between the first differential pair 110 and the second differential pair 120. That is, the conductive vias 53-2 extend along a direction in which the first differential pair 110 extends in the first opening 160*a* of the second patterned conductive layer 51-2 and along a direction in which the second differential pair 120 extends in the second opening 160*b* of the second patterned conductive layer 51-2. It should be mentioned that the conductive vias 53-2 are located next to or between the first differential pair 110 and the second differential pair 120, which may further enhance the shielding effects achieved by the first and second ground planes 150 and 160.

In addition, according to the present embodiment, the first differential pair 110 may be a transmitting differential pair Tx+ and Tx− compatible with USB 3.0 or USB 3.1; the second differential pair 120 may be a receiving differential pair Rx+ and Rx− compatible with USB 3.0 or USB 3.1; the third differential pair 130 may be a transmitting/receiving differential pair D+ and D− compatible with USB 1.0 or USB 2.0. Besides, the main extension traces T2 of the first and second differential pairs 110 and 120 are arranged at the second patterned conductive layer 51-2, and the main extension traces T1 of the third differential pair 130 are arranged at the first patterned conductive layer 51-1. Namely, the first and second differential pairs 110 and 120 are located at the same grounded layer, while the first differential pair 110 or the second differential pair 120 is located at a layer different from the layer where the third differential pair 130 is located. Therefore, during the USB 3.0 or 3.1 signal transmission through the first and second differential pairs 110 and 120 (at the clock frequency of approximately 2.5 GHz), the interference (e.g., EMI/RFI) with the environment may be reduced due to the vertical shielding effect achieved by the first ground plane 150 and the horizontal shielding effect achieved by the second ground plane 160. In addition, the frequency interference issue does not frequently arise at the third differential pair 130 which transmits USB 1.0 or 2.0 signals, and thus the third differential pair 130 may be located at the topmost layer (e.g., the first patterned conductive layer 51-1) in the same manner as that provided in the related art.

With reference to FIG. 1, FIG. 3, and FIG. 4, the electrical connector 14 described in the present embodiment is suitable for plugging a wireless module 20 of a wireless mouse 30. Signals are transmitted between the wireless module 20 and the wireless mouse 30 in a wireless manner. If the clock frequency (2.5 GHz) at which the first and second differential pairs 110 and 120 depicted in FIG. 4 transmit signals is substantially equal to or similar to the operating frequency (2.4 GHz) of the wireless module 20, the electromagnetic waves generated by the first and second differential pairs 110 and 120 may be vertically blocked by the first ground plane 150 and horizontally blocked by the second ground plane 160, so as to reduce the RFI with the wireless module 20 and allow the wireless mouse 30 to work as usual.

To sum up, according to an embodiment of the invention, the first and second differential pairs initially arranged at the non-grounded patterned conductive layer are moved to the grounded patterned conductive layer; through the vertical shielding effect achieved by the first ground plane and the horizontal shielding effect achieved by the second ground plane, the interference with the environment during signal transmission through the first and second differential pairs can be reduced.

As to the device (e.g., a hub) applying the USB 3.0 transmission protocol (with the clock frequency at 2.5 GHz) and the existing device with the operating frequency at 2.5 GHz, the resultant interference with the environment can be reduced according to an embodiment of the invention, such that the RFI with the wireless device (e.g., the wireless module of the wireless mouse) with the operating frequency at 2.4 GHz (close to 2.5 GHz) can also be reduced.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A circuit layout structure suitable for a circuit board, the circuit board having a chip area, a port area, a first patterned conductive layer, a second conductive layer, a dielectric layer, and a plurality of conductive vias, the first patterned conductive layer and the second patterned conductive layer being separated from each other by the dielectric layer, the conductive vias being electrically connected to the first patterned conductive layer and the second patterned conductive layer, the circuit layout structure comprising:
   a first differential pair extending from an inside of the chip area to an outside of the chip area through the first patterned conductive layer and extending between the chip area and the port area through the second patterned conductive layer;
   a second differential pair extending from the inside of the chip area to the outside of the chip area through the first patterned conductive layer and extending between the chip area and the port area through the second patterned conductive layer;
   a third differential pair extending from the chip area to the port area through the first patterned conductive layer;
   a first ground plane constituted by the first patterned conductive layer, an orthogonal projection of the first differential pair on the second patterned conductive layer overlapping the first ground plane, an orthogonal projection of the second differential pair on the second patterned conductive layer overlapping the first ground plane; and
   a second ground plane constituted by the second patterned conductive layer, the second ground plane having a first opening and a second opening, the first differential pair and the second differential pair respectively extending in the first opening and the second opening through the second patterned conductive layer.

2. The circuit layout structure as recited in claim 1, wherein the conductive vias are located next to the first differential pair and the second differential pair, located between the first differential pair and the second differential pair, or located next to and between the first differential pair and the second differential pair.

3. The circuit layout structure as recited in claim 1, wherein the first differential pair extends from an outside of the port area to an inside of the port area through the first patterned conductive layer, and the second differential pair extends from the outside of the port area to the inside of the port area through the first patterned conductive layer.

4. The circuit layout structure as recited in claim 1, wherein the first differential pair is directly connected up to the port area of the first patterned conductive layer, and the second differential pair is directly connected up to the port area of the first patterned conductive layer.

5. The circuit layout structure as recited in claim 1, wherein a portion of the second ground plane is located between the first differential pair and the second differential pair.

6. The circuit layout structure as recited in claim 1, wherein the first differential pair is a transmitting differential pair Tx+ and Tx− compatible with USB 3.0 or USB 3.1, the second differential pair is a receiving differential pair Rx+ and Rx− compatible with USB 3.0 or USB 3.1, and the third differential pair is a transmitting/receiving differential pair D+ and D− compatible with USB 1.0 or USB 2.0.

7. The circuit layout structure as recited in claim 1, wherein the first differential pair or the second differential pair has vertical shielding effect achieved by the first ground plane and the horizontal shielding effect achieved by the second ground plane.

8. A circuit board suitable for a chip and an electrical connector to be installed on the circuit board, the circuit board having a chip area where the chip is installed and a port area where the electrical connector is installed, the circuit board comprising:
   a plurality of patterned conductive layers comprising a first patterned conductive layer and a second patterned conductive layer, wherein the first patterned conductive layer is an outermost patterned conductive layer of the patterned conductive layers, and the second patterned conductive layer is adjacent to the first patterned conductive layer;
   a plurality of dielectric layers, the dielectric layers and the patterned conductive layers being alternately stacked;
   a plurality of conductive vias passing through the dielectric layers, so as to connect the patterned conductive layers; and
   a circuit layout structure comprising:
      a first differential pair extending from an inside of the chip area to an outside of the chip area through the first patterned conductive layer and extending between the chip area and the port area through the second patterned conductive layer;
      a second differential pair extending from the inside of the chip area to the outside of the chip area through the first patterned conductive layer and extending between the chip area and the port area through the second patterned conductive layer;
      a third differential pair extending from the chip area to the port area through the first patterned conductive layer;
      a first ground plane constituted by the first patterned conductive layer, an orthogonal projection of the first differential pair on the second patterned conductive layer overlapping the first ground plane, an orthogonal projection of the second differential pair on the second patterned conductive layer overlapping the first ground plane; and
      a second ground plane constituted by the second patterned conductive layer, the second ground plane having a first opening and a second opening, the first differential pair and the second differential pair respectively extending in the first opening and the second opening through the second patterned conductive layer.

9. The circuit board as recited in claim 8, wherein the conductive vias are located next to the first differential pair and the second differential pair, located between the first differential pair and the second differential pair, or located next to and between the first differential pair and the second differential pair.

10. The circuit board as recited in claim 8, wherein the first differential pair extends from an outside of the port area to an inside of the port area through the first patterned conductive layer, and the second differential pair extends from the outside of the port area to the inside of the port area through the first patterned conductive layer.

11. The circuit board as recited in claim 8, wherein a portion of the second ground plane is located between the first differential pair and the second differential pair.

12. The circuit board as recited in claim 8, wherein the first differential pair is a transmitting differential pair Tx+ and Tx− compatible with USB 3.0 or USB 3.1, the second differential pair is a receiving differential pair Rx+ and Rx− compatible with USB 3.0 or USB 3.1, and the third differential pair is a transmitting/receiving differential pair D+ and D− compatible with USB 1.0 or USB 2.0.

13. The circuit board as recited in claim 8, wherein the patterned conductive layers further comprise a third patterned conductive layer and a fourth patterned conductive layer, the dielectric layers comprise a dielectric core layer, a first dielectric layer, and a second dielectric layer, the first dielectric layer is located between the first patterned conductive layer and the second patterned conductive layer, the dielectric core layer is located between the second patterned conductive layer and the third patterned conductive layer, the second dielectric layer is located between the third patterned conductive layer and the fourth patterned conductive layer, and a thickness of the dielectric core layer is greater than a thickness of the first dielectric layer and a thickness of the second dielectric layer.

14. The circuit board as recited in claim 13, wherein the third patterned conductive layer substantially constitutes a power plane.

15. An electronic assembly comprising:
a circuit board having a chip area and a port area, the circuit board comprising:
a plurality of patterned conductive layers comprising a first patterned conductive layer and a second patterned conductive layer, wherein the first patterned conductive layer is an outermost patterned conductive layer of the patterned conductive layers, and the second patterned conductive layer is adjacent to the first patterned conductive layer;
a plurality of dielectric layers, the dielectric layers and the patterned conductive layers being alternately stacked;
a plurality of conductive vias passing through the dielectric layers, so as to connect the patterned conductive layers; and
a circuit layout structure comprising:
a first differential pair extending from an inside of the chip area to an outside of the chip area through the first patterned conductive layer, extending between the chip area and the port area through the second patterned conductive layer, and extending from an outside of the port area to an inside of the port area through the first patterned conductive layer;
a second differential pair extending from the inside of the chip area to the outside of the chip area through the first patterned conductive layer, extending between the chip area and the port area through the second patterned conductive layer, and extending from the outside of the port area to the inside of the port area through the first patterned conductive layer;
a third differential pair extending from the chip area to the port area through the first patterned conductive layer;
a first ground plane constituted by the first patterned conductive layer, an orthogonal projection of the first differential pair on the second patterned conductive layer overlapping the first ground plane, an orthogonal projection of the second differential pair on the second patterned conductive layer overlapping the first ground plane; and
a second ground plane constituted by the second patterned conductive layer, the second ground plane having a first opening and a second opening, the first differential pair and the second differential pair respectively extending in the first opening and the second opening through the second patterned conductive layer;
a chip installed in the chip area of the circuit board; and
an electrical connector installed in the port area of the circuit board.

16. The electronic assembly as recited in claim 15, wherein the conductive vias are located next to the first differential pair and the second differential pair, located between the first differential pair and the second differential pair, or located next to and between the first differential pair and the second differential pair.

17. The electronic assembly as recited in claim 15, wherein the first differential pair extends from an outside of the port area to an inside of the port area through the first patterned conductive layer, and the second differential pair extends from the outside of the port area to the inside of the port area through the first patterned conductive layer.

18. The electronic assembly as recited in claim 15, wherein a portion of the second ground plane is located between the first differential pair and the second differential pair.

19. The electronic assembly as recited in claim 15, wherein the first differential pair is a transmitting differential pair Tx+ and Tx− compatible with USB 3.0 or USB 3.1, the second differential pair is a receiving differential pair Rx+ and Rx− compatible with USB 3.0 or USB 3.1, and the third differential pair is a transmitting/receiving differential pair D+ and D− compatible with USB 1.0 or USB 2.0.

20. The electronic assembly as recited in claim 15, wherein the patterned conductive layers further comprise a third patterned conductive layer and a fourth patterned conductive layer, the dielectric layers comprise a dielectric core layer, a first dielectric layer, and a second dielectric layer, the first dielectric layer is located between the first patterned conductive layer and the second patterned conductive layer, the dielectric core layer is located between the second patterned conductive layer and the third patterned conductive layer, the second dielectric layer is located between the third patterned conductive layer and the fourth patterned conductive layer, and a thickness of the dielectric core layer is greater than a thickness of the first dielectric layer and a thickness of the second dielectric layer.

21. The electronic assembly as recited in claim 15, wherein the electrical connector is suitable for plugging a wireless module, and an operating frequency of the wireless module is substantially equal to a clock frequency of signals transmitted by the first differential pair or the second differential pair.

* * * * *